United States Patent
Dai et al.

(10) Patent No.: US 6,322,718 B1
(45) Date of Patent: Nov. 27, 2001

(54) PIEZOELECTRIC CERAMIC COMPOSITIONS AND METHODS FOR PRODUCTION THEREOF

(75) Inventors: Xunhu Dai, Gilbert, AZ (US); Donald W. Forst, Albuquerque, NM (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/399,976

(22) Filed: Sep. 21, 1999

(51) Int. Cl.$^7$ .................................................. C04B 35/491
(52) U.S. Cl. ..................... 252/62.9 PZ; 501/134
(58) Field of Search ...................... 252/62.9 PZ; 501/134

(56) References Cited

U.S. PATENT DOCUMENTS

| | | | |
|---|---|---|---|
| 4,866,016 | 9/1989 | Ando et al. | 501/134 |
| 5,024,980 | 6/1991 | Negas et al. | 501/134 |
| 5,147,835 | 9/1992 | Franzak et al. | 501/136 |
| 5,792,379 | 8/1998 | Dai et al. | 252/62.9 |

OTHER PUBLICATIONS

Derwent abstract 1973–49563U for SU 361,992, 1973*.*
Li et al, "Low Temperature Sintering of PZT Ceramics", Ferroelectrics, vol. 101, pp. 101–108, 1990*.*
1973*.*

Gui Zhilun et al., "Low–Temperature Sintering Of Lead–Based Piezoelectric Ceramics" *American Ceramic Society*, Jul. 11, 1988, vol. 72, No. 3, pp. 486–491.

\* cited by examiner

*Primary Examiner*—C. Melissa Koslow
(74) *Attorney, Agent, or Firm*—Jones, Day, Reavis & Pogue

(57) ABSTRACT

Low loss piezoelectric ceramic compositions cofirable with silver at a reduced sintering temperature and methods for producing the such compositions are provided. The compositions are binary piezoelectric ceramic compositions having a first component which is characterized by about 95.0 to about 99.5 weight percent of a system represented by a general formula $Pb(Zr_xTi_{1-x})O_3$+y wt % $MnO_2$ in which x and y represent weight percentages and wherein x is within a range from 0.0 to about 1.0, and y is within a range from about 0.1 to about 1.0. The compositions also have 0.5 to 5.0 wt % of a second component represented by the general formula w wt % $Bi_2O_3$–z wt % CdO in which w and z represent weight percentages and wherein w is within a range from about 0.1 to about 1.0, and z is within a range from about 0.1 to about 2.0. The piezoelectric ceramic compositions are non-reactive with a silver electrode layer when cofired therewith at sintering temperatures of about 900° C. and may be employed to produce piezoelectric transformers having a voltage breakdown of about 50 kv/cm or more.

11 Claims, No Drawings

PIEZOELECTRIC CERAMIC COMPOSITIONS AND METHODS FOR PRODUCTION THEREOF

BACKGROUND OF THE INVENTION

1. Field of the Invention

The present invention relates to piezoelectric (PZT) ceramic compositions. More particularly, it relates to low-loss PZT ceramic compositions cofirable with silver at a reduced sintering temperature and to methods for producing such compositions.

2. Description of Related Art

The low-temperature sintering of lead-based piezoelectric ceramics has been studied extensively by those in the electronic materials industry. For example, it has been found that through the addition of various frits, glass additives or softening agents, the sintering temperature of lead zirconate titanate (PZT) ceramics may be reduced from about 1250° C. to about 960° C. Furthermore, it has been found that, in general, the sintering temperature of a lead based piezoelectric ceramic may be reduced by doping the piezoelectric composition with low-melting oxides.

Reference is made to an article titled "Low-Temperature Sintering of Lead-Based Piezoelectric Ceramics" by Gui Zhilun et al., Department of Chemical Engineering, Tsinghua University, Beijing, China (J. Am. Ceram. Soc., 72[3] 486–91 (1989)). This article discusses how to reduce the sintering temperature of a PZT composition by the addition of a small amount of a lower melting frit, $B_2O_3$—$Bi_2O_3$—CdO, while maintaining desirable electrical properties. Although this article discusses hard (low-loss) PZT ceramic materials, the sintering temperature is still too high for large scale manufacturing of PZT ceramics cofirable with a pure silver electrode material. As such, this composition may be of limited use in a large scale production environment.

U.S. Pat. No. 5,433,917 issued Jul. 18, 1995 to Srivastava et al. teaches the manufacture of a morphotropic PZT ceramic composition having reduced sintering temperatures and a process for producing the same. In this patent, the PZT is sintered with an effective amount of an eutectic mixture of copper oxide (CuO) and an oxide of an alkaline earth metal, preferably barium oxide and/or strontium oxide, to reduce the sintering temperature of the PZT composition to about 1000° C.

Although this patent discusses the addition of CuO as part of the frit, it deals primarily with soft-PZT materials which typically have high loss characteristics and are typically not intended for use in high power applications. This patent also addresses only a very narrow field of compositions, namely morphotropic lead zirconium titanate piezoelectric ceramic compositions, containing about 52(mole or atomic) % lead zirconate and 48(mole or atomic) % lead titanate.

It has been found that the compositions taught in the U.S. Pat. No. 5,433,917 patent are of limited use in the large scale manufacture of piezoelectric ceramic products such as piezoelectric multilayer transformers where low-loss properties accompanied by moderate coupling capabilities are desirable. In particular, a sintering temperature in the range of about 950° C. still poses major cofiring problems with conventional silver (Ag) compositions, which typically have a melting temperature of about 962° C., and which are used to form the electrode patterns in standard multilayer packages. Potential problems during the sintering process may include, but are not limited to, silver-ceramic reactions at boundary layers, volatile silver vapor resulting in bubbles or trapped gases, uneven or incomplete shrinkage or densification, degradation of electrical properties, or delamination, all leading to possible product failure.

To combat these adverse effects of sintering so close to the melting point of Ag, many manufacturers have chosen to employ a silver-palladium (Ag—Pd) electrode composition. Ag—Pd compositions have a melting point which is dependent upon the Pd content in the composition. For example, a 90% Ag-10% Pd composition has a melting temperature of about 1020° C. This higher temperature processing can become very expensive compared to the processing costs associated with pure Ag electrode compositions. Higher sintering temperatures necessitate the use of more expensive noble metals such as Pt, Pd, Au, or their alloys (which have higher melting points) as the internal electrode material. Thus, use of lower sintering temperature PZT materials may result in substantial savings in the cost of electrode materials as well as substantial savings in energy necessary for high temperature firing.

Commonly assigned, U.S. Pat. No. 5,792,379, issued to the same inventors as the present application, discloses a low loss PZT composition capable of being cofired with a silver electrode layer at temperatures of about 900° C. The composition consists of a main composition and an additive, the main composition being PZT and the additive comprising a glass frit composed of a combination of $B_2O_3$, $Bi_2O_3$, and some other metal oxide (MeO). However, the composition disclosed in the U.S. Pat. No. 5,792,379 patent employs a glass frit additive that adds extra steps which involve the making of glass and cost to the production of the PZT composition. Thus, it would be desirable to provide a PZT composition that can be formulated without the use of a glass additive.

Another problem encountered with prior art compositions is that the low-melting additions, which decrease the sintering temperature, also may modify the properties of the ceramics, causing degradation of the electrical properties of the composition which render these compositions impractical for their intended purposes as low-loss devices.

SUMMARY OF THE INVENTION

The present invention is direct to a glass-free piezoelectric ceramic composition comprising:

a first component represented by the general formula:

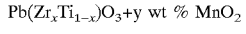
$Pb(Zr_xTi_{1-x})O_3 + y$ wt % $MnO_2$ in which x is a mole percentage and y is a weight percentage and wherein x is within a range from 0.0 to about 1.0 mole or atomic %, and y is within a range from about 0.1 to about 1.0; and a second component represented by the general formula:

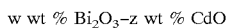
$w$ wt % $Bi_2O_3$–$z$ wt % CdO in which w and z represent weight percentages and wherein w is within a range from about 0.1 to about 1.0, and z is within a range from about 0.1 to about 2.0.

The present invention is also directed to method for producing piezoelectric ceramic compositions as described above. The present invention further includes a piezoelectric transformer formed from a piezoelectric ceramic composition as described above and a method for production thereof.

DETAILED DESCRIPTION

The piezoelectric ceramic composition of the present invention includes at least a first component and a second component.

The First Component

The first component is represented by the following formula:

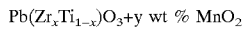
$$Pb(Zr_xTi_{1-x})O_3 + y \text{ wt \% } MnO_2$$

in which x is a mole percentage and y is a weight percentage and wherein $0 \leq x < 1.0$ and $0.1 \leq y \leq 1.0$.

Manganese dioxide ($MnO_2$) is a known metal oxide dopant used to reduce the dielectric losses in PZT ceramic compositions. The addition of about 0.1 to 1.0 weight percent $MnO_2$ to the main composition of the first and second components is also known to promote densification as well as to enhance the mechanical quality factor ($Q_m$). The addition of a small amount of $MnO_2$ will increase $Q_m$. However, if too much $MnO_2$ is added to the main composition, then other electrical properties, such as the dielectric constant (k') or the coupling coefficients ($K_t$ & $K_p$), may be reduced to an unacceptable level. Also, the amount of $MnO_2$ should not be less than 0.1 or $Q_m$ will not be sufficiently increased. Conversely, the amount of $MnO_2$ should not be greater than 1.0 weight percent or k', $K_t$, and $K_p$ may be decreased to unacceptable levels.

An important feature of this invention is the low-temperature sinterability of the composition, which is achieved through a predetermined and specially formulated additive, and which can be applied over the entire PZT diagram. Stated another way, the sintering additive can be incorporated with zirconium/titanium (Zr/Ti) compositions having molar ratios from 100% zirconiumn/0% titanium to 0% zirconium/100% titanium. The aforementioned compositional flexibility is significant because different piezoelectric compositions are often required for different applications. For example, a Rosen-Type piezoelectric transformer application may require a composition with a Zr/Ti ratio close to the morphotropic phase boundary. On the other hand, for a high power/low turns ratio application such as a multilayer-stack piezoelectric transformer, a higher relative percentage of $PbTiO_3$ as compared with $PbZrO_3$ could be utilized. There will be considerably more Ti than Zr in this composition. Nevertheless, by incorporating a predetermined amount of the second component into the composition, a low sintering temperature composition cofirable with pure Ag at about 900° C. is provided.

The Second Component

A second component is added to the first component to lower the sintering temperature while maintaining good electrical properties of the resultant composition. The second component is represented by the general formula:

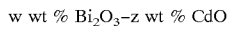
$$w \text{ wt \% } Bi_2O_3 - z \text{ wt \% } CdO$$

in which w and z represent weight percentages and wherein $0.1 \leq w \leq 1.0$ and $0.1 \leq z \leq 2.0$.

The amount of the second component preferably ranges from 0.5 to 5.0 weight percent of the total composition of first and second components. Although more or less of the second component may be added to the first component, certain disadvantages may occur. For example, if more than 5.0 weight percent is added, then the electrical properties of the PZT composition may be degraded. In addition, if less than 0.5 weight percent is added, there may be insufficient densification of the PZT composition at a sintering temperature of 900° C.

One ingredient in the second component is bismuth oxide. Bismuth oxide ($Bi_2O_3$) has a melting temperature of 825° C. Although not intending to be bound by theory, the significance of this component is realized at the atomic level. The ionic radii of $Bi^{3+}$ and $Bi^{5+}$ are 0.96 Å and 0.74 Å, respectively, comparing to that of $Ti^{4+}$ (0.68 Å) and $Zr^{4+}$ (0.79 Å). Replacement of $Ti^{4+}$ and/or $Zr^{4+}$ by $Bi^{3+}$ and $Bi^{5+}$ ions is believed to result in the constraining of domain walls in the PZT grain due to the larger ionic radius of the replacement ions. This is believed to have the effect of reducing both dielectric and mechanical losses.

The amount of the $Bi_2O_3$ in the second component preferably ranges from 0 to 0.80 weight percent of the weight of the second component. Although more $Bi_2O_3$ may be added, certain disadvantages may occur. For example, although not intending to be bound by theory, it is believed that if the content of the $Bi_2O_3$ exceeds 0.80, then the PZT may difficult to completely densify because it is postulated that the excess $Bi_2O_3$ exceeds the solubility limit of Bi into the PZT lattice structure in the given time domain of interest.

Another ingredient in the second component is CdO. CdO is added to the composition to reduce the sintering temperature and improve the loss characteristics ($Q_m$ and tan δ). Although other additives are available to reduce the sintering temperature, CdO is preferred because it does not increase the electrical and mechanical losses as much as other additives.

METHODS OF PRODUCTION

The following are Examples of preferred methods of preparing a piezoelectric ceramic composition according to the present invention.

EXAMPLE 1

A composition was prepared using PbO, $ZrO_2$, $TiO_2$, CdO, and $MnO_2$ as raw materials. A mixture with the proper amounts (the amounts depended on composition needed) of PbO, $ZrO_2$, $TiO_2$, CdO, and $MnO_2$ was wet-milled with a ball mill for 12 hours and then dried in an oven. The dried powder was then screened through a 40 mesh sieve and placed in an alumina crucible. Next, the powder was calcined at 850°–900° C. for 1–4 hours, then crushed and ground to prepare calcined powder having such a particle size that the particles could pass through a 100 mesh sieve.

$Bi_2O_3$ powder was added to the mixture and wet mixed in a vibratory mill for 12 to 16 hours until a particle size of 1 to 4 μm was achieved. The mixture was then dried in an oven. Next, 1–3 wt % polyvinyl alcohol and 0.5–1.5 wt % polyethylene glycol were added to the dried mixture. The mixture was formed into pellets using a uniaxial dry press at approximately 10,000 psi. Green, unfired pellets were then sintered at 900° C. for 2–6 hours.

EXAMPLE 2

A composition was prepared using PbO, $ZrO_2$, $TiO_2$, and $MnO_2$ as raw materials. A mixture with the proper amounts (the amounts depended on composition needed) of PbO, $ZrO_2$, $TiO_2$, and $MnO_2$ was wet-milled with a ball mill for 12 hours and then dried in an oven. The dried powder was then screened through a 40 mesh sieve and placed in an alumina crucible. Next, the powder was calcined at 850°–900° C. for 1–4 hours, then crushed and ground to prepare calcined powder having such a particle size that the particles could pass through a 100 mesh sieve.

$Bi_2O_3$ and CdO powders were added to the mixture and wet mixed in a vibratory mill for 12 to 16 hours until a particle size of 1 to 4 μm was achieved. The mixture was then dried in an oven. Next, 1–3 wt % polyvinyl alcohol and 0.5–1.5 wt % polyethylene glycol were added to the dried mixture. The mixture was formed into pellets using a uniaxial dry press at approximately 10,000 psi. Green, unfired pellets were then sintered at 900° C. for 3–6 hours.

Properties

The properties of several examples of the piezoelectric ceramic compositions of the present invention were measured. The density of the sintered pellets was determined by the Archimedes method. The fired pellets were sliced to a thickness of approximately 0.4 mm and sputtered with gold (Edwards S150B) to form electrodes thereon. The electroded discs were then poled at 120° C. at an electric field 25–40 kV/cm for 5–10 minutes. The coupling coefficient ($d_{33}$) was measured using a Berlincourt meter to assure the samples were properly poled.

Measurement was performed on a computer-controlled Hewlett-Packard 4194A Impedance/Gain-Phase Analyzer. The measured parameters were: dielectric constant (k'), dielectric loss factor (tan δ), mechanical quality factor ($Q_m$), relative permittivity (∈) (∈=k'-1≈k') thickness coupling coefficient ($K_t$), planar coupling coefficient ($K_p$), as well as density (measured in g/cm³). These experimental results are provided in the following TABLE 1.

TABLE 1

Properties of $Pb(Zr_{0.55}Ti_{0.45})O_3$ + 0.3 wt % $MnO_2$, sintered at 900° C. for 4 hours, poled at 25 kV/cm with sintering additives.

| Additive | Additive Amount | Density (g/cm³) | $Q_m$ | k' (1 kHz) | tan δ (%) | $K_p$ | $K_t$ |
|---|---|---|---|---|---|---|---|
| $Bi_2O_3$/CdO | 0.5 wt %/0.05 wt % | 7.63 | 360 | 400 | 0.54 | 0.45 | 0.44 |
| $Bi_2O_3$/CdO | 0.5 wt %/0.10 wt % | 7.71 | 430 | 400 | 0.62 | 0.45 | 0.45 |
| $Bi_2O_3$/CdO | 0.5 wt %/0.25 wt % | 7.85 | 420 | 490 | 0.53 | 0.47 | 0.45 |
| $Bi_2O_3$/CdO | 0.5 wt %/0.50 wt % | 7.85 | 420 | 510 | 0.51 | 0.46 | 0.45 |
| $Bi_2O_3$/CdO | 0.5 wt %/0.75 wt % | 7.83 | 500 | 530 | 0.58 | 0.45 | 0.44 |
| $Bi_2O_3$/CdO | 0.5 wt %/1.0 wt % | 7.83 | 500 | 540 | 0.49 | 0.45 | 0.44 |
| $Bi_2O_3$/CdO | 0.5 wt %/1.5 wt % | 7.77 | 660 | 560 | 0.55 | 0.36 | 0.36 |
| $B_2O_3$—$Bi_2O_3$—CdO (glass) (prior art) | 2 wt % | 7.81 | 500 | 440 | 0.23 | 0.44 | 0.46 |

Piezoelectric ceramic materials are known to have a perovskite crystal lattice structure. A generic perovskite crystal structure is shown by the general formula $A^{2+}B^{4+}O_3$. The selection of certain materials in the formulation of these compositions results in changes to the crystal structure during sintering. For example, the incorporation of Bi results in $Bi^{3+}$ ions on the A-site and $Bi^{3+}$ and $Bi^{5+}$ ions on the B-site of the perovskite structured PZT. This results in improved properties during sintering.

Another feature of the compositions of the present inventions are that the sintering additives can be incorporated directly into the PZT lattice to enhance certain electric and piezoelectric properties of the PZT composition. For example, a relatively high dielectric constant, high mechanical quality factor ($Q_m$), relatively high coupling factors and low dielectric loss properties may all be desirable for applications such as a piezoelectric trans former.

In one preferred embodiment of the present invention, the piezoelectric ceramic composition will be particularly suited for high-power, high-voltage piezoelectric applications. The desirable electrical properties include a low mechanical loss $Q_m$ of about 400 or more, a k' of 500 or more a planar coupling coefficient $K_p$ of about 0.35 or more, a thickness coupling coefficient $K_t$ of about 0.40 or more, a density of about 7.4 g/cm³ or more, a dielectric constant k' value of about 600 or more, and a tan δ factor of about 1% or less.

The compositions of the present invention may be achieved by a conventional mixed-oxide process. Those skilled in the art will understand this to mean that various oxide powders are mixed, calcined, and fired to achieve a composition with the desired properties.

The internal electrodes of typical high-temperature fire multilayer piezoelectric devices typically comprise a silver palladium alloy, most preferably a 70% silver/30% palladium alloy or a 90% silver/10% palladiun alloy. An important feature of the compositions of the present inventions are that they are custom formulated such that they can be used with a pure silver paste.

In summary, the present invention provides PZT ceramic compositions which are cofirable with silver at a reduced sintering temperature of 900° C. or less without the use of a glass additive, and which are non-reactive with a silver electrode layer when cofired therewith. The compositions of the present invention can be fully densified at low temperatures, and can maintain desired electrical properties of a low-loss PZT while also being adaptable to large scale manufacturing processes. The piezoelectric compositions may be further processed to produce specific components such as a multilayered ceramic transformer device, for example. The piezoelectric ceramic compositions may be cofired with silver electrode layers at a temperature of about 900° C. and, due to the properties of the compositions, the electrode layers are non-reactive with the piezoelectric ceramic compositions. One typical application for the present piezoelectric ceramic compositions may be as piezoelectric transformers used in a high voltage application wherein the voltage breakdown is about 50 kv/cm or more.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What we claim is:

1. A piezoelectric ceramic composition comprising:
a first component represented by the general formula:

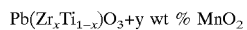

$Pb(Zr_xTi_{1-x})O_3$+y wt % $MnO_2$ in which x is a mole percentage and y is a weight percentage and wherein x is within a range from 0.0 to about 1.0, andy is within a range from about 0.1 to about 1.0; and a second component represented by the general formula:

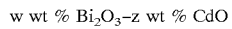

w wt % $Bi_2O_3$–z wt % CdO in which w and z represent weight percentages and wherein w is within a range from about 0.1 to about 1.0, and z is within a range from about 0.1 to about 2.0.

2. The piezoelectric ceramic composition according to claim 1, wherein the piezoelectric ceramic composition is nonreactive with a silver electrode layer when cofired therewith at sintering temperatures of about 900° C.

3. The piezoelectric ceramic composition according to claim 1, wherein the piezoelectric ceramic composition is a hard PZT ceramic.

4. The piezoelectric ceramic composition according to claim 1, wherein said first component is present in the composition at a weight percent ranging from about 95 to about 99.5 weight percent and said second component is present in the composition at a weight percent ranging from about 0.5 to about 5 weight percent.

5. The piezoelectric ceramic composition according to claim 1, wherein the piezoelectric ceramic composition is produced by a mixed-oxide process.

6. The piezoelectric ceramic composition according to claim 1, wherein said second component is glass-free.

7. The piezoelectric ceramic composition according to claim 1, wherein the piezoelectric ceramic composition has the following properties:

mechanical loss ($Q_m$) of about 400 or greater;

(k') of 500 or more;

planar coupling coefficient ($K_t$) of about 0.35 or greater;

thickness coupling coefficient ($K_p$) of about 0.40 or greater;

density of 7.4 g/cm³ or greater;

dielectric constant (k') of about 600 or greater; and tan δ of about 1% or less.

8. A piezoelectric ceramic composition comprising:

a first component represented by the general formula:

$$Pb(Zr_xTi_{1-x})O_3 + y \text{ wt \% } MnO_2$$

in which x mole percentage and represent y weight percentages and wherein x is 0.55 or 55% and y is 0.3%;

a second component represented by the general formula:

$$w \text{ wt \% } Bi_2O_3 + z \text{ wt \% } CdO$$

in which w and z represent weight percentages and wherein w is 0.5 and z is 1.5.

9. A piezoelectric transformer having a voltage breakdown of about 50 kv/cm or more produced from a piezoelectric ceramic composition comprising:

a first component represented by the general formula:

$$Pb(Zr_xTi_{1-x})O_3 + y \text{ wt \% } MnO_2$$

in which x is a mole percentage and y is a weight percentage and wherein x is within a range from 0.0 to about 1.0, and with y being within a range from about 0.1 to about 1.0; and a second component represented by the general formula:

$$w \text{ wt \% } Bi_2O_3 - z \text{ wt \% } CdO$$

in which w and z represent weight percentages and wherein w is within a range from about 0.1 to about 1.0, and z is within a range from about 0.1 to about 2.0.

10. A method of making a piezoelectric ceramic composition comprising:

a first component represented by the general formula:

$$Pb(Zr_xTi_{1-x})O_3 + y \text{ wt \% } MnO_2$$

in which x is a mole percentage and y is a weight and wherein x is within a range from 0.0 to about 1.0, and y is within a range from about 0.1 to about 1.0; and a second component represented by the general formula:

$$w \text{ wt \% } Bi_2O_3 - z \text{ wt \% } CdO$$

in which w and z represent weight percentages and wherein w is within a range from about 0.1 to about 1.0, and z is within a range from about 0.1 to about 2.0, the method comprising the steps of:

preparing a mixture by first mixing PbO, $ZrO_2$, $TiO_2$, CdO, and $MnO_2$ in amounts corresponding to the above weight percentages;

wet-milling the mixture with a ball mill for 12 hours;

drying the mixture in an oven;

screening the mixture through a 40-mesh sieve.

calcining the mixture at 850°–900° C. for 1–4 hours;

pulverizing the mixture so that the resulting powder has a particle size capable of passing through a 100 mesh sieve;

adding $Bi_2O_3$ to the mixture in an amount corresponding to the above weight percentages in a wet-mill vibration mill for 12–16 hours to form a second mixture;

drying the second mixture; and sintering the second mixture at 900° C. for 2–6 hours.

11. A method of making a piezoelectric ceramic composition comprising:

a first component represented by the general formula:

$$Pb(Zr_xTi_{1-x})O_3 + y \text{ wt \% } MnO_2$$

in which x is a mole percentage and y is a weight percentage and wherein x is within a range from 0.0 to about 1.0, and y is within a range from about 0.1 to about 1.0; and a second component represented by the general formula:

$$w \text{ wt \% } Bi_2O_3 - z \text{ wt \% } CdO$$

in which w and z represent weight percentages and wherein w is within a range from about 0.1 to about 1.0, and z is within a range from about 0.1 to about 2.0, the method comprising the steps of:

preparing a mixture by first mixing PbO, $ZrO_2$, $TiO_2$, and $MnO_2$;

wet-milling the mixture with a ball mill for 12 hours;

drying the mixture in an oven;

screening the mixture through a 40-mesh sieve.

calcining the mixture at 850°–900° C. for 1–4 hours;

pulverizing the mixture so that the resulting powder has a particle size capable of passing through a 100 mesh sieve;

adding $Bi_2O_3$ and CdO to the mixture in a wet-mill vibration mill for 12–16 hours to form a second mixture;

drying the second mixture; and sintering the second mixture at 900° C. for 2–6 hours.

* * * * *